United States Patent [19]
Tsukamoto et al.

[11] 3,967,057
[45] June 29, 1976

[54] AUTOMATIC TUNING APPARATUS

[75] Inventors: Kazuyoshi Tsukamoto, Hirakata; Yoshiaki Sakauchi, Nara; Yukio Saito, Higashiosaka; Kazufumi Ushijima, Hirakata, all of Japan

[73] Assignee: Sanyo Electric Co., Japan

[22] Filed: Jan. 25, 1974

[21] Appl. No.: 436,534

[30] Foreign Application Priority Data
| | | |
|---|---|---|
| Aug. 30, 1973 | Japan | 48-94759 |
| Aug. 31, 1973 | Japan | 48-98640 |
| Sept. 10, 1973 | Japan | 48-101956 |
| Oct. 26, 1973 | Japan | 48-120977 |

[52] U.S. Cl............. 178/5.8 A; 325/470; 325/423; 334/16; 331/36 C
[51] Int. Cl.²............ H04N 5/60; H04B 1/32; H03J 1/02; H04B 3/04
[58] Field of Search..... 178/5.8 R, 5.8 AF, DIG. 15; 324/182; 325/422, 416, 418, 419, 420, 421, 452, 453, 458, 464, 465, 490, 468, 470, 423; 334/11, 13, 14, 15, 16; 331/36 C, 36 R, 34

[56] References Cited
UNITED STATES PATENTS

| | | | |
|---|---|---|---|
| 3,588,706 | 6/1971 | Sakai et al. | 325/423 |
| 3,631,349 | 12/1971 | Rhee | 325/422 |
| 3,634,700 | 1/1972 | Worchester | 325/422 |
| 3,706,041 | 12/1972 | Krausser | 325/422 |
| 3,715,495 | 2/1973 | Takezaki et al. | 178/5.8 |
| 3,753,110 | 8/1973 | Ikeda et al. | 324/182 |
| 3,757,260 | 9/1973 | Fujita | 325/465 |
| 3,867,568 | 2/1975 | Merriweather | 178/5.8 |

*Primary Examiner*—Benedict V. Safourek
*Assistant Examiner*—R. John Godfrey
*Attorney, Agent, or Firm*—Staas & Halsey

[57] ABSTRACT

An automatic tuning apparatus, such as an automatic channel selector as incorporated in a television receiver, comprising a tuner using a voltage controlled variable capacitance diode such that the variable capacitance thereof constitutes a portion of a tuning circuit of the tuner for changing the tuning frequency, and a solid state electrochemical potential memory devices an output voltage of which is clamped as selected by selective manual operation, the resultant voltage being applied to the capacitance diode in a reverse direction, which memory device is controlled so as to be charged or discharged in response to selective manual operation until an increased or decreased terminal voltage thereof decreases or increases the capacitance across the diode and thus increases or decreases the tuning frequency of the tuner and a particular frequency is tuned. An intermediate frequency output, obtained as a result of tuning, is used to disable the abovementioned charging or discharging operation of the potential memory device.

22 Claims, 22 Drawing Figures

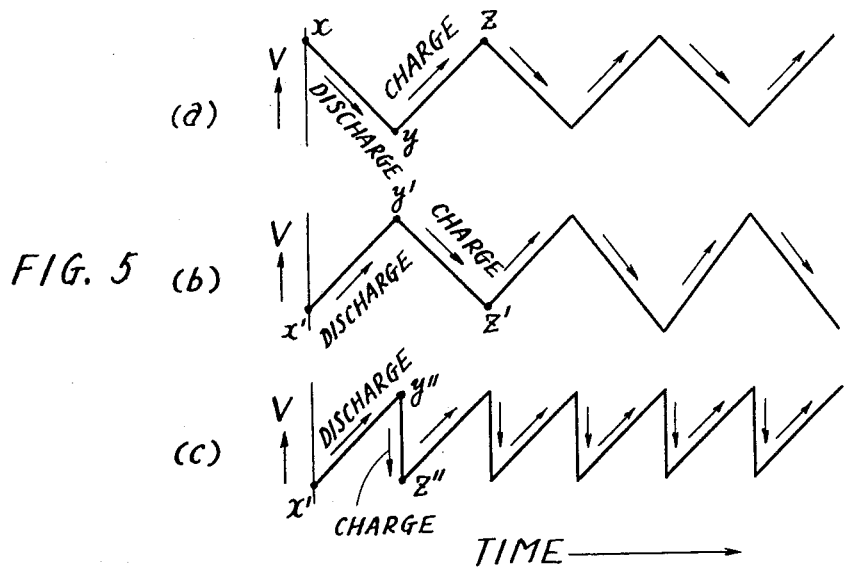
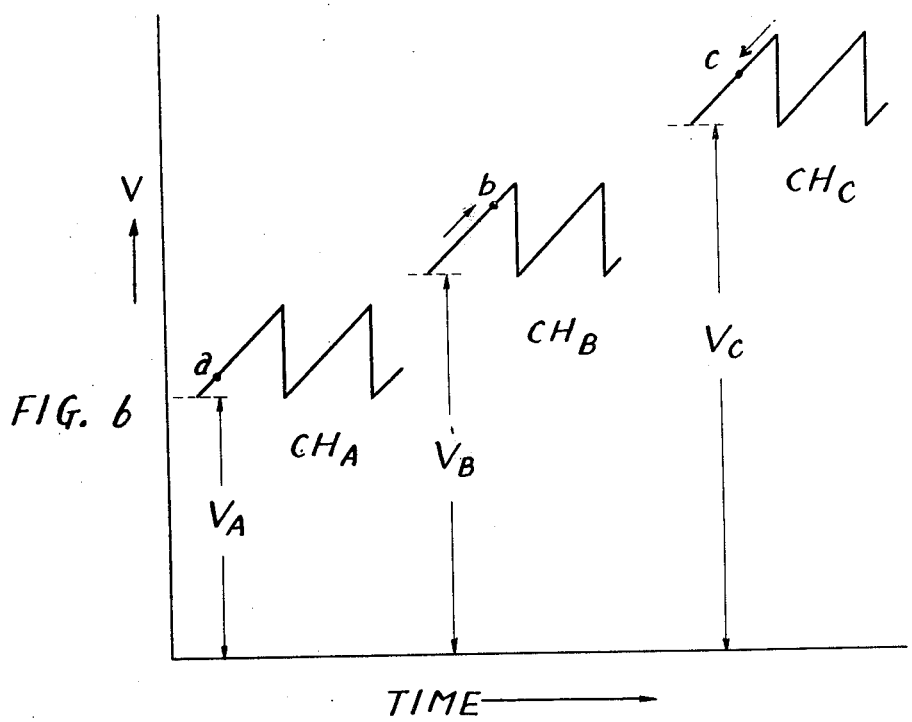

AUTOMATIC TUNING APPARATUS

BACKGROUND OF THE INVENTION

1. Field of the Invention

The present invention relates to an automatic tuning apparatus. More specifically, the present invention relates to an improved automatic tuning apparatus using a voltage controlled variable reactance device.

2. Description of the Prior Art

In reception of the television broadcast, it is necessitated to select a desired channel out of several television broadcast channels. One of the typical channel selectors so far employed in selection of television channels is a rotary switch. However, a rotary switch usually makes a circuit through a mechanical touch between paired contacts performed by manual rotating operation. For this reason a rotary switch always suffers fatally from a poor electrical contact between the paired contacts caused by deterioration of the contact surfaces, a tiresome manual operation and a noise caused by rotating operation thereof.

Recently a television channel selecting apparatus for selecting VHF television channels employing a voltage controlled variable capacitor has been proposed and will be expected to be widely used in the future. Such a voltage controlled variable capacitor uses a capacitance formed at a barrier portion of a diode, variable as a function of a reverse voltage applied thereto, and is also known as a variable capacitance diode. In such a television channel selecting apparatus, it is necessary to provide a voltage supply capable of providing a plurality of different voltages in response to manual operation each corresponding to a value which causes a respective capacitance valve in accordance with which the television channel selecting apparatus selects a desired corresponding channel. One type of such a voltage supply for providing a plurality of different voltages comprises a reference voltage source and a plurality of potential dividers for dividing the voltage of the source, each being selectively operable in response to individual manual operation. Another type of such a voltage supply for providing different voltages to a variable capacitance diode comprises a capacitor and a charging/discharging circuit therefor, a voltage across the capacitor, as selected in response to an output of the channel selecting apparatus, being applied to the variable capacitance diode. More specifically, the capacitor is charged or discharged by the charging/discharging circuit until a voltage across the capacitor causes capacitance in the diode in accordance with which the selector selects a corresponding television channel to provide a tuning outpt therefrom, at which time the charging/discharging circuit is disabled and no longer continues to charge or discharge the capacitor, so that the voltage thus provided across the capacitor remains the same. If another channel is desired, the charging/discharging circuit is again enabled through manual operation and the abovementioned operation is repeated until another channel is selected. Nevertheless the voltage across the capacitor gradually becomes lower because of leakage through an undesired leakage path, which causes detuning of the selecting apparatus and thus results in a poor quality of picture on a screen of a cathode ray tube of the television receiver. In order to solve such a problem it is required to provide a circuit for compensating the decrease in voltage across the capacitor because of leakage, which makes the circuit complicated and the system expensive. Another disadvantage in the television channel selecting apparatus using a variable capacitance diode supplied with a voltage across the capacitor is that the voltage across the capacitor is charged or discharged in an exponential manner rather than in a linear manner, which makes it difficult to achieve precise automatic tuning. It is desired that an improved voltage supply source for providing different voltages to a variable capacitance diode is provided, which is suited for employment in an automatic tuning apparatus.

A voltage storing device of interest in connection with the present invention is disclosed in U.S. Pat. No. 3,753,110, issued Aug. 14, 1973 to Hironosuke Ikeda et al. and assigned to Sanyo Electric Co., Ltd. the same assignee as that of the present invention. As set forth in the referenced patent, Professor Takehiko Takahashi and Assistant Professor Osamu Yamamoto, Technological Department of Nagoya University, announced their study on the electrochemical potential memory device by the use of a solid state electrolyte at the 22nd annual assembly of Japan Chemical Association held on Apr. 5 to 7, 1969. Briefly stated, this device comprises an Ag electrode as a cathode, an Ag—Te alloy electrode as an anode, and a solid state electrolyte having high ion conductivity, such as $RbAg_4I_5$ sandwiched between both electrodes. When a DC voltage is applied to the device so that the Ag electrode may be negative, a portion of Ag contained in the Ag—Te alloy electrode migrates over to the Ag electrode, resulting in a decreased activity of Ag in the Ag—Te alloy, and thus an increased potential difference between both electrodes. The inventors of this device termed this states of operation as "charging". When the polarity of the applied DC voltage is reversed to that of the former case, Ag is refilled into the Ag—Te alloy, resulting in the decreased potential difference and returns to the initial value eventually. The inventors of this device termed this state of operation as "discharging". Study disclosed by the inventors of this device indicates that the electromotive force generated by the abovementioned charging or discharging current can cause linear change to some extent with respect to the charging or discharging time. Thus, this device makes it possible, as an outstanding characteristic, to do write-in and non-destructive read-out operation while preserving relatively linear relation between the charging or discharging time and terminal voltage, and in addition, it can hold the memory condition for a relatively longer period of time. These advantages mean that this device has opened a way for its potential use as an analogue memory device. The referenced patent further discloses an improved electrochemical potential memory device. More specifically, FIG. 6 of the referenced patent shows an improved electrochemical potential memory device for eliminating the IR drop across the resistance in the electrolyte and the overvoltage caused by dissolution or deposition of Ag, which is basically characterized by the rpovision of an auxiliary cathode that comprises an output terminal for detecting the potential separately from the abovementioned cathode available for the input terminal for the current conduction.

In view of these advantageous characteristics of the abovementioned memory device, it may be possible to utilized this device as an essential component of a solid state variable voltage supply source. The present invention has thus been accomplished by the inventors in order that such possibility may be realized.

SUMMARY OF THE INVENTION

Briefly stated, the present invention comprises an automatic tuning apparatus comprising (1) a solid state electrochemical potential memory device for providing different voltages to a voltage controlled variable reactance device coupled, or associated, with a tuning circuit of the automatic tuning apparatus, (2) means for clamping or level-shifting selectively the terminal voltage of the potential memory device, and (3) a control circuit controllable in response to an output of said tuning circuit for selectively charging or discharging said potential memory device. Said control circuit may be manually operable for enabling the control circuit. The said control circuit is preferably controlled responsive to a threshold detector such that the charging or discharging operation of the potential memory device may be reversed in response to a threshold detection output of the terminal voltage of the potential memory device as at an upper threshold and a lower threshold.

Said solid state electrochemical potential memory device exhibits a terminal voltage between an anode and a cathode linearly changing as a function of the charging or discharging quantity of electricity fed to said device, and is capable of holding the terminal voltage. Accordingly, the characteristic features of the solid state electrochemical potential memory device can advantageously be combined with an automatic tuning apparatus using a voltage controlled variable reactance device, such as a voltage controlled variable capacitance diode. Capacitance of a voltage controlled variable reactance device is subject to the clamped output voltage from the clamping means, i.e. the terminal voltage of the potential memory device, as clamped or level-shifted. The clamped output voltage is used to bias the voltage controlled variable reactance device so that the tuning frequency of the tuning circuit may be approximately equal to the desired frequency to be tuned. By applying the clamped output voltage to the voltage controlled variable reactance device, precise tuning to one or more desired tuning frequency is achieved.

Therefore, a principal object of the present invention is to provide an improved automatic tuning apparatus using a voltage controlled variable reactance device supplied with a control voltage by a solid state electrochemical potential memory device.

Another object of the present invention is to provide an automatic tuning apparatus capable of achieving an automatic tuning operation in a very quick manner.

Another object of the present invention is to provide an automatic tuning apparatus capable of achieving an automatic tuning operation with precision.

A further object of the present invention is to provide an automatic tuning apparatus suitable for use in a television receiver.

Still a further object of the present invention is to provide an automatic tuning apparatus using a voltage controlled variable reactance device supplied with a control voltage by a solid state electrochemical potential memory device, which is also used for the purpose of automatic frequency control.

These objects and other objects and features of the present invention will be better understood when taken in conjunction with the following detailed description made with reference to the accompanying drawings.

BRIEF DESCRIPTION OF THE DRAWINGS

FIGS. 5a, 5b and 5c are timing diagrams illustrating the operation of the electrochemical potential memory device, FIG. 6 shows the operation of the apparatus of the invention.

In the drawings, the like reference characters designate the like portions.

DESCRIPTION OF THE PREFERRED EMBODIMENT:

As described in the foregoing section of Description of the Prior Art, the present invention utilizes the prior art electrochemical potential memory device including a solid state electrolyte. As described already, this device has a significant characteristic of the terminal voltage or electromotive force changing in an approximately linear way with respect to the charging or discharging quantity of electricity passing therethrough. Accordingly, prior to a detailed description of the present invention, it would be appropriate to give a more detailed description of such electrochemical potential memory device.

Figure 1:
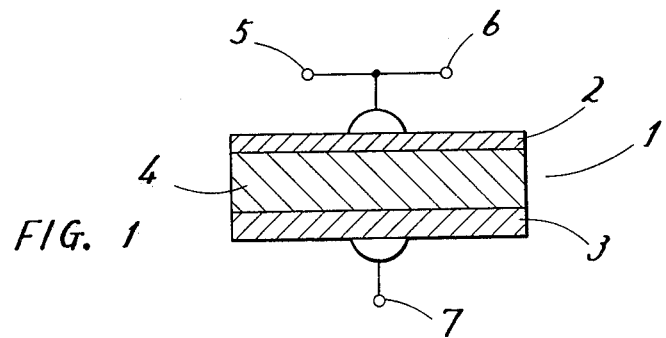
FIG. 1 illustrates a schematic sectional view of an electrochemical potential memory device to be used in the apparatus of the present invention.

FIG. 1 illustrates a schematic sectional view of an electrochemical potential memory device 1 which is used in the apparatus of the present invention. It may be considered that this device is a kind of cell which comprises a solid state electrolyte 4 of high ion conductivity, such as $RbAg_4I_5$ or $Ag_3SI$, sandwiched by a cathode 2 mainly including silver (Ag) and an anode 3 mainly including an alloy of silver and a member selected from the group consisting of sulfer (S), selenium (Se) and tellurium (Te). preferably an Ag—Te alloy. When a DC voltage is applied between booth electodes 2 and 3 of this device 1 through an input terminal 5 and a common terminal 7, respectively, in such a way that the anode 3 of this device may be positive and the cathode 2 may be negative, silver contained in the Ag—Te alloy in the anode 3 is ionized to be dissolved into the solid state electrolyte 4 and is deposited on the cathode 2. In this specification, such a state of operation is referred to as "charging" hereinafter. When a DC voltage is applied to the abovementioned device in the directly opposite polarity to the above case, silver deposited over the cathode 2 migrates onto the anode 3 and is deposited thereupon. In this specification, such a state of operation is referred to as "discharging" hereinafter.

Figure 2:
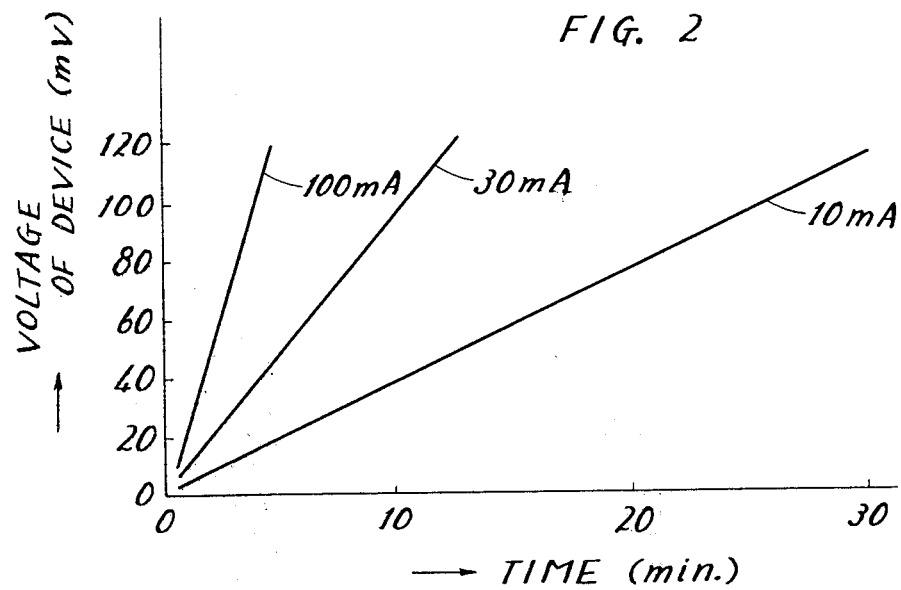
FIG. 2 is a graph which indicates a relation between the charging or discharging time, and thus the quantity of electricity, and the electromotive force of the FIG. 1 device by taking the current for charging or discharging the device as a parameter.

FIG. 2 is a graph which indicates the relation between the charging or discharging time, and thus the quantity of electricity, and the electromotive force of the abovementioned device, as detected between the both electrodes 2 and 3 through an output terminal 6 and the common terminal 7, respectively, by taking the current for charging or discharging the device as a parameter. As illustrated in FIG. 2, the following facts of function have been clarified; that the electromotive force of this device as a cell indicates the value dependent upon the activity of silver contained in the Ag—Te alloy of cathode 3, that the activity of silver varies to a large measure by any slight charging or discharging performance when the atomic composition ratio of silver and tellurium contained in the Ag—Te alloy approximates to a value of 2, and that the relation between the abovementioned electromotive force and the charging or discharging quantity of electricity $i \cdot t$, where $i$ is a current value and $t$ is time, generally indicates a linear relation during the charging or discharging period in case of the electromotive force of relatively low voltage range (from 0(zero) to 100mV. as per the embodiment illustrated in FIG. 2) and also in case of the current density of relatively low order (less than $100\mu A/cm^2$ as per the embodiment illustrated in FIG. 2). In this connection, it is to be pointed out that application of a given voltage to the device in either charging or discharging manner causes substantially a constant current to flow therethrough and therefore the said linear relation is also applicable to the characteristic between the terminal voltage of the device and the charging or discharging time.

It has further been known that this device has an additional characteristic capable of holding the potential as established immediately before cutting-off the current, after the cutting-off of the current supplied to this device, for the abovementioned voltage range (from 0(zero) to 100mV. as per the embodiment illustrated in FIG. 2).

Accordingly, the present invention is directed to providing an automatic tuning apparatus in which a tuning function is achieved by providing different terminal voltages of the device, selected as desired, to a voltage controlled variable reactance device which constitutes a part of a tank circuit, by the skillful use of the advantageous characteristic of the device capable of holding the selected potential.

It is understood that the embodiments described with reference to FIG. 1 includes terminals 5 and 6 connected in common to a single cathode 2 by means of which the charging or discharging current is supplied and also the terminal voltage of the device is detected. In this connection it is recalled that the device shown in FIG. 1 can be considered as a cell, as mentioned previously. Therefore, in case of such device as comprising a common cathode for supply of the current and for detection of the terminal voltage, the detected output voltage is a total of an electromotive force of the device and of an overvoltage of the device as a cell. This results in the fact that the initiation or the termination of the electric current conduction into the device causes influence of the overvoltage on the detected voltage and therefore the output voltages detected at the device 1 immediately before and after the change of electrical current conduction state are different. This means that the voltage holding characteristic of the device is degraded. It has been found that the said degradation of the voltage holding characteristic is aggravate by the fact that an increased current for charging and discharging the device causes a greater overvoltage, resulting in more inaccurate tuning. Thus it is desired to provide an improved potential memory device that eliminates the abovementioned problem.

The overvoltage as occurs in the electrochemical potential memory device causing a voltage drop after the cutting-off, or termination of the current conduction into the device may be classified as follows:

1. A voltage drop caused by the current flowing through the resistance involved in the solid state electrolyte of the device (or an IR drop across the resistance in the electrolyte).

2. An overvoltage caused by dissolution or deposition of Ag at an interface between the electrolyte and the anode or cathode.

3. An overvoltage caused by diffusion of Ag ion into the anode.

Figure 3:
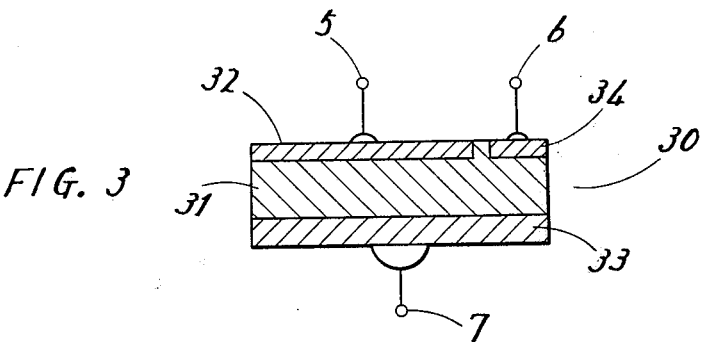
FIG. 3 shows a schematic sectional view of an improved electrochemical potential memory device for eliminating the IR drop across the resistance in the electrolyte and the overvoltage caused by dissolution or deposition of Ag.

FIG. 3 shows a schematic sectional view of an improved electrochemical potential memory device 30 for eliminating the IR drop across the resistance in the electrolyte as described in the above subsection (1) and the overvoltage caused by dissolution or deposition of Ag as described in the above subsection (2). The device 30 shown in FIG. 3 is basically characterized by the provision of an auxiliary cathode 34 that comprises an output terminal 6 for detecting the potential separately from the abovementioned cathode 32 available for the input terminal 5 for the current conduction. More specificaally, the device shown in FIG. 3 essentially comprises a solid state electrolyte 31 composed of $Ag_3SI$, an anode 33 composed of an Ag—Te alloy, a cathode 32 composed of Ag, and an auxiliary cathode 34 composed also of Ag.

Figure 4:
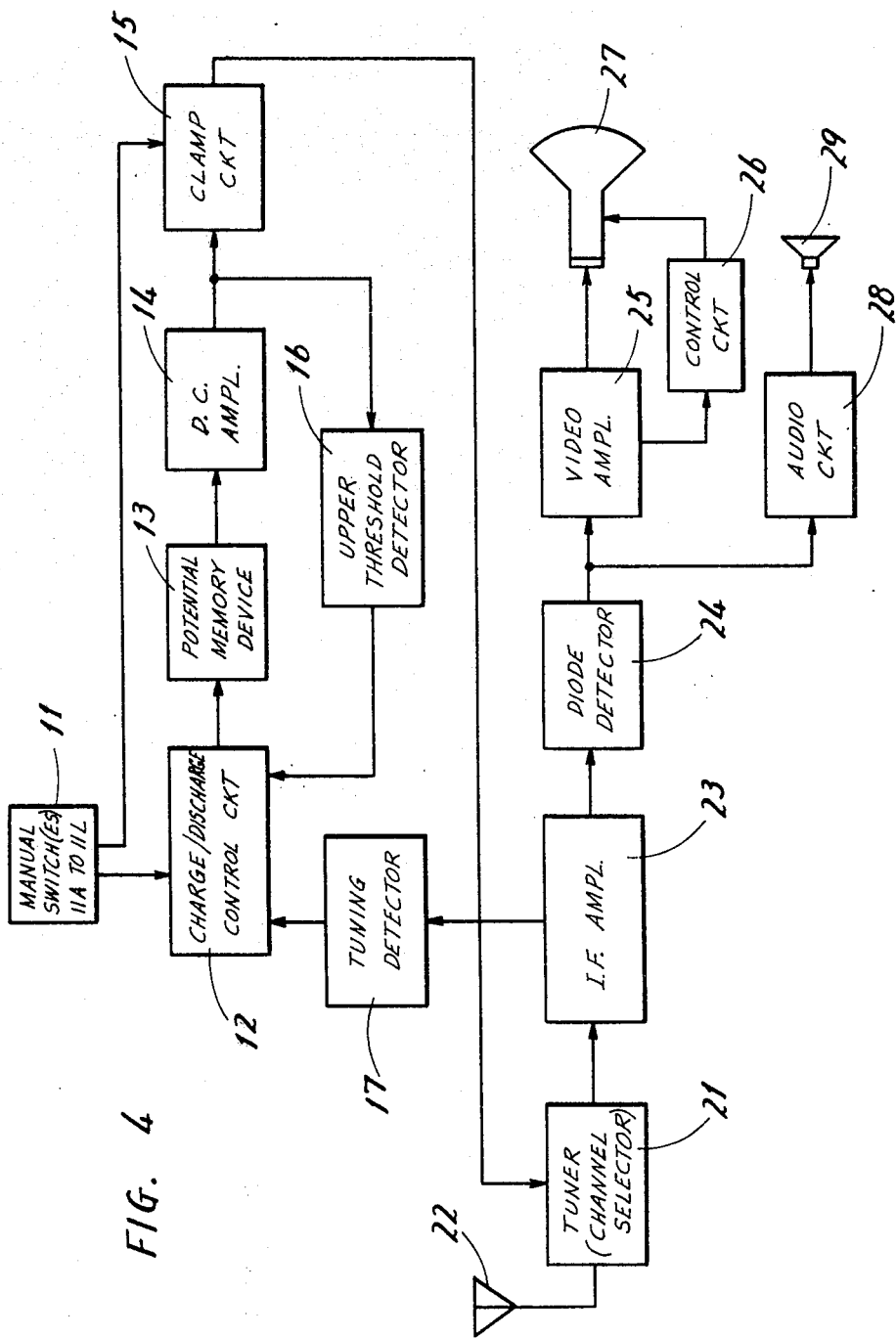
FIG. 4 illustrates a block diagram of a television receiver embodying the present invention using the abovementioned potential memory device.

FIG. 4 illustrates a block diagram of a television receiver embodying the present invention using the abovementioned potential memory device. A typical television receiver is shown in the lower half portion of the FIG. 4 diagram, which comprises an antenna 22, a tuner or channel selector 21, an intermediate frequency amplifier 23, a diode detector 24, a video amplifier 25, a control circuit 26, a cathode ray tube 27, a sound, or audio circuit 28, and a speaker 29. The tuner or channel selector 21 usually comprises a high frequency amplifier, a local oscillator and a mixer. For the purpose of embodying the present invention, the channel selector of the television receiver shown further comprises voltage controlled variable reactance devices, which are connected so as to constitute a part of a tank circuit for the high frequency amplifier and the local oscillator, as to be more fully described hereinafter. A typical and preferred voltage controlled variable reactance device of a solid state type now commercially available is a voltage controlled variable capacitor. As described in the foregoing, such a voltage controlled variable capacitor uses a capacitance formed at a barrier portion of a semiconductor diode, which is decreased or increased as a reverse voltage applied thereacross is increased or decreased, respectively, and is also known as a variable capacitance diode. However, it should be understood that any type of a voltage controlled variable reactance device can be used for the purpose of the present invention, so far as it is available. The control circuit 26 of a typical monochrome television receiver comprises a synchronizing pulse circuit, vertical and horizontal deflection circuits, a high voltage circuit, or the like, required for operation of the cathode ray tube 27. If the present invention is employed in a color television receiver, then the control circuit 26 might further comprise such additional circuits as required for reception of the color television signal.

FIG. 4 also shows in the upper half portion thereof an embodiment of an automatic tuning apparatus incorporated in the abovementioned television receiver. Briefly stated, the automatic tuning apparatus shown is enabled to start tuning operation by manual operation of a switch, which causes the abovementioned potential memory device to be charged or discharged. The variable voltage across the potential memory device is applied to a clamp circuit, and thus clamped correspondingly to the respective TV channel selected through manual operation of the switch. The resultant clamped output voltage is applied to the voltage controlled variable capacitance diode connected, or associated, with tank circuits in the channel selector, until a desired one of channels is selected as a result of tuning in the channel selector, at which time a tuning output is obtained in a form of an intermediate frequency signal from the intermediate frequency amplifier, which is used to stop charging or discharging of the potential memory device, with the result that a television channel is automatically selected. A further detailed description of the automatic tuning apparatus shown is given in the following with particular reference to the upper half portion of the FIG. 4 diagram.

Referring again to FIG. 4, the automatic tuning device comprises a manually operable switch 11 for starting the scanning of the television channel, which comprises a plurality of (e.g. 12) channel switches 11A to 11L (not shown in FIG. 4), each of which corresponds to TV channels individually. A charging/discharging control circuit 12 is enabled to initate charging or discharging of a potential memory device 13 as a function of an enabling signal from the switch 11, said charging or discharging being determined as a function of a charging/discharging control signal from a tuning detector 17, and is disabled to discontinue further charging and discharging operation as a function of a disabling signal from the tuning detector 17 obtainable when tuning is achieved, as to be described hereinafter. An output of the potential memory device 13 is supplied to a DC amplifier 14 which amplifies and inverts the output of the device 13. A clamp circuit 15 provides DC voltages corresponding to the selected channels individually for clamping or level-shifting the output from the DC amplifier 14 to a desired level associated with the selected channels. An output from the clamp circuit 15 is fed to the voltage controlled variable capacitor in the channel selector 21, as to be more fully described hereinafter. As described before, the charging/discharging control circuit 12 is caused to charge or discharge the device 13 in response to the charging/discharging control signal output indicative of the degree of the tuning of the channel selector 21 from the tuning detector 17 receiving the intermediate frequency output, and is disabled in response to the disabling signal from the tuning detector 17 at the time when the tuning to the desired channel is achieved. On the other hand, an output from the amplifier 14 is also fed to an upper threshold detector 16. Assuming that the control circuit 12 is in a discharging operation mode, the output from the detectors 16 in response to a predetermined upper threshold detection of the amplified and inverted output from the amplifier 14 is fed to the charging/discharging control circuit 12, so that the circuit 12 is caused to change the discharging operation mode to the charging operation mode which is maintained for a predetermined time period. In the predetermined time period of charging operation mode, the circuit 12 controls the device 13 such that the device 13 is charged in a very quick manner. Upon completion of the charging operation mode, the circuit 12 resumes a discharging operation mode. The abovementioned change of operation mode in response to the upper threshold detection of the amplified output prevents the device 13 from being damaged due to overcharging.

The operation of the FIG. 4 embodiment will be better understood by the following description with simultaneous reference to FIGS. 5 and 6, which show a relation between voltages appearing at various portions in FIG. 4 diagram and the lapse of time. For the purpose of describing the operation of the embodiment shown, first let it be assumed that any one of channel switches 11A to 11L is manually operated. Further let it be assumed that no television signal has been broadcast in any channel. FIG. 5(a) shows a relation of the output terminal voltage of the potential memory device 13 and the lapse of time for the purpose of explaining a principle of operation of the inventive apparatus in such a situation. More specifically, when any one of channel switches 11A to 11L is manually operated, the charging/discharging control circuit 12 is enabled to be in a discharging mode and thus the potential memory device 13 is discharged, as specifically defined in the present specification. A change in the voltage at the output terminal of the device 13 is shown in FIG. 5(a) as from a point x to a point y. The output terminal voltage of the device 13 is amplified and inverted by the amplifier 14, as shown in FIG. 5(b). The upper threshold detector 16 detects an output voltage from the amplifier 14 at a point y', which corresponds to the voltage of the device 13 at the point y. The threshold-detected output from the detector 16 causes the charging/discharging control circuit 12 to be in a charging mode for a predetermined time period, and thus the potential memory device 13 is charged thereafter, as specifically defined in the present specification. After the charging time period, the charging/discharging control circuit 12 is caused to be in a discharging mode again. A change in the voltage at the output terminal of the device 13 during this period of time is shown in FIG. 5(a) as from the point y to a point z. Thereafter the same operation is repeated as mentioned above.

FIG. 5(b) shows a change in the voltage at the output of the DC amplifier 14, in which the point $y'$ and $z'$ correspond to the points $y$ and $z$, respectively, in the graph of FIG. 5(a).

In the foregoing, the principle of operation of the invention apparatus was described with reference to FIGS. 5(a) and (b) graphs. However, as described before, in the preferred embodiment, the charging operation mode is effected in a very quick manner. The output from the amplifier 14 is such embodiment is shown in FIG. 5(c), which is of a saw tooth wave form. The points $x''$, $y''$ and $z''$ correspond to the points $x'$, $y'$ and $z'$ in FIG. 5(b), respectively. The embodiment shown will be described hereinafter as using the above described saw tooth wave form in FIG. 5(c), rather than the wave form in FIG. 5(b) from the amplifier 14.

Referring to FIG. 6, a wave form of a clamped voltage output to be supplied from the clamp circuit 15 to the channel selector 21 is illustrated. The output from the amplifier 14, as shown in FIG. 5(c), is enhanced or clamped by the clamping voltages $V_A$, $V_B$, $V_C$, . . . which each correspond to the TV channel $CH_A$, $CH_B$, $CH_C$, . . . , respectively, to be selected through the operation of switch 11. Therefore, it is necessary to choose each range of change in voltage of output from the clamp circuit 15 such that the said each range suffices to cover a voltage value which is required to receive a corresponding television channel with the use of the channel selector 21 employing the said voltage controlled variable capacitor so as to be supplied with the said clamped output voltage values. It is to be pointed out that in FIG. 6 voltage values corresponding to frequencies of carrier waves of television channels $CH_A$, $CH_B$, $CH_C$, . . . are shown as to $a$, $b$, $c$, . . . respectively.

Now let it be assumed that some television broadcasting stations are broadcasting using different channels in a certain area. Further let it be assumed that the potential memory device 13 has been charged to a point $z$. When one of channel switches 11A to 11L, e.g. the channel switch 11A is manually operated, the inventive automatic tuning apparatus is caused to be in a discharging mode, or an upward scanning mode, and the clamping voltage in the clamp circuit 15 is determined to be the voltage $V_A$. When a clamped output voltage from the clamp circuit 15 comes to correspond to a frequency of carrier wave in which a television signal has been broadcast, the channel selector 21 automatically makes tuning to the frequency and selects the channel $CH_A$, so that an intermediate frequency output is provided at the intermediate frequency amplifier 23 and the output is provided to the tuning detection circuit 17. The output from the detection circuit 17 is fed to the charging/discharging control circuit 12 to disable it so that discharging mode is discontinued. Such a state as thus established is kept unchanged and thus the voltage of the memory device 13 remains the same until a further manual operation of the switch 11.

Upon depression of channel switch 11B for receiving the TV channel $CH_B$ after the channel $CH_A$ was selected, the voltage which was obtained from the DC amplifier 14 when the channel selector 21 was tuned to the channel $CH_A$ is increased by the clamping voltage $V_B$ from the clamping circuit 15, and the resultant voltage is applied to the voltage controlled capacitor. If the resultant voltage is lower than that required for the tuning to the channel $CH_B$, then the control circuit 12 causes the potential memory device 13 is to be discharged, and thus the output from the amplifier 14 to be increased toward the point b of FIG. 6. In this way, the channel selector 21 tunes to the channel $CH_B$.

Upon manual operation of the different switch 11C corresponding to the channel $CH_C$, a clamping voltage $V_C$ is selected and the charging/discharging control circuit 12 is placed in a charging mode responsive to the output from the tuning detector 17 indicative of the degree of the tuning to charge the device 13 so that the output from the amplifier 14 is reduced in a reverse direction toward the point c, at which tuning to the channel $CH_C$ is achieved.

In case the voltage from the DC amplifier 14 comes to be at the point $y''$, in the discharging mode, because of absense of any broadcasting TV channel, the threshold detector 16 operates so that the charging/discharging control circuit 12 is controlled to be in a charging mode. Upon completion the charging mode of the predetermined short time period, as mentioned before, the control circuit 12 resumes a discharging mode and thereafter these modes are repeated.

In case where a slight detuning occurs in the channel selector 21, the charging/discharging control circuit 12 causes the device 13 to be charged or discharged responsive to the output from the tuning detector 17 until the precise tuning in the channel selector 21 is obtained. As a result an automatic frequency control is achieved and thus precise tuning can be effected in an automatic manner in the inventive automatic tuning apparatus using a voltage controlled reactance device in combination with the abovementioned potential memory device.

Figure 7:
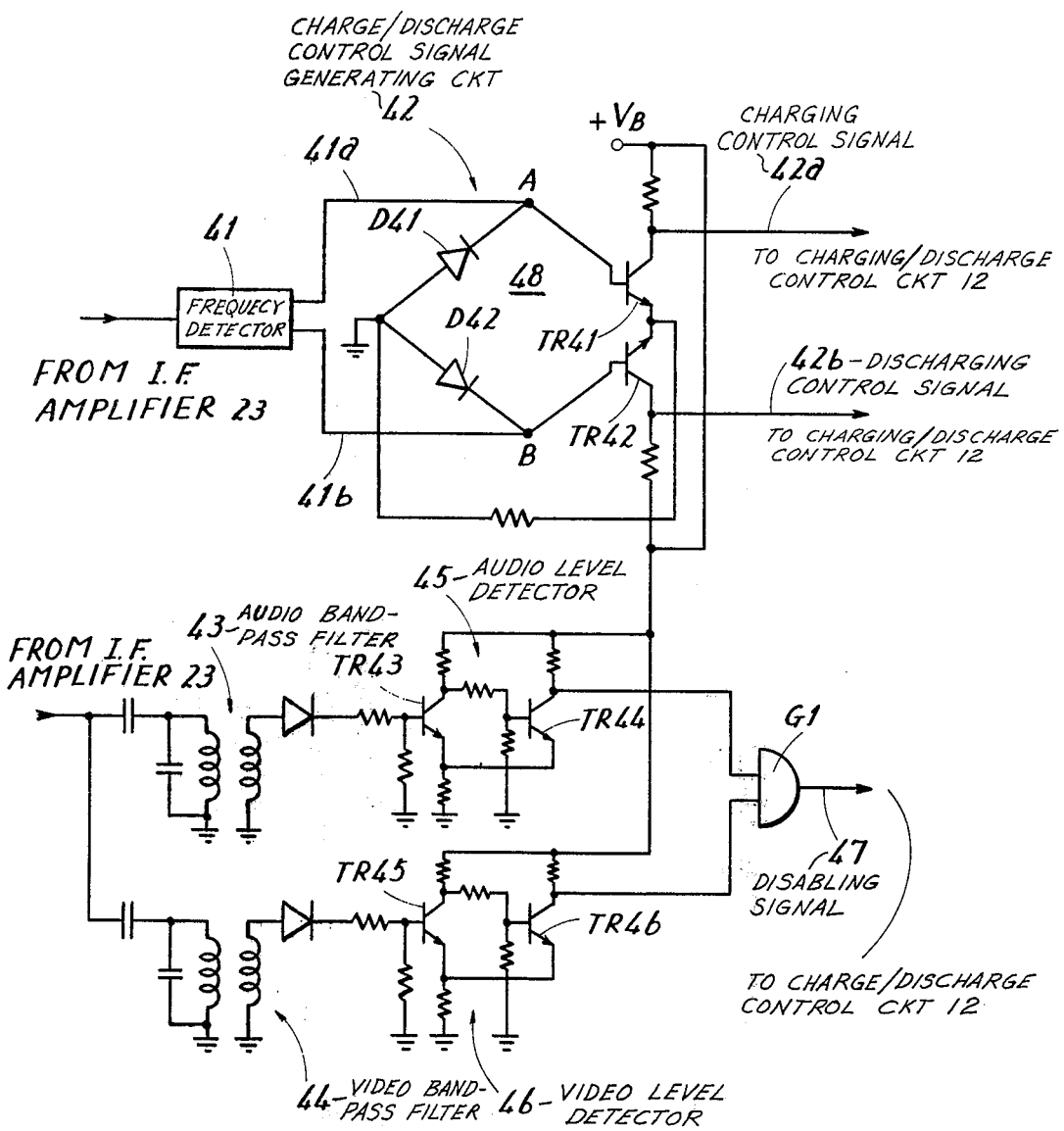
FIG. 7 shows in more detail a schematic diagram of the tuning detector 17.

FIG. 7 shows in more detail a schematic diagram of the tuning detector 17, which comprises a frequency detector 41 coupled to the intermediate frequency amplifier 23 for detecting the intermediate frequency output, a charging/discharging control signal generating circuit 42 coupled to the frequency detector 41 such as a ratio detector, for providing a charging control signal 42a and a discharging control signal 42b to the control circuit 12, band-pass filters 43 and 44 for choosing the sound and video components, respectively, of the intermediate frequency output from the amplifier 23, level detectors 45 and 46 for detection of the level of the sound and video components from the filters 43 and 44, respectively, and an AND G1 responsive to the simultaneous detection outputs from level detectors 45 and 46 for providing a disabling signal 47 for disabling the control circuit 12.

Figure 8:
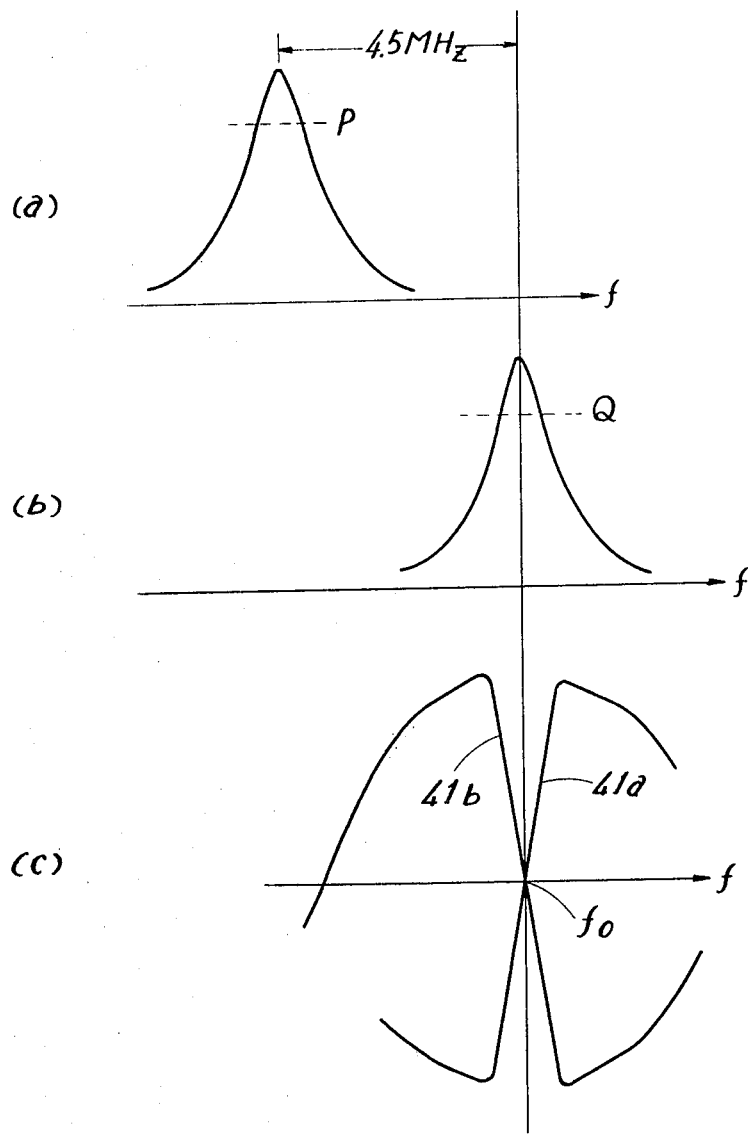
FIGS. 8a, 8b and 8c are graphs showing a relation between the magnitude of the signals at various portions of FIG. 7 diagram and the frequency of the signals.

A detailed description will be made of the FIG. 7 diagram with simultaneous reference to FIG. 8, which shows a graph showing a relation between the magnitude of the signals at various portions of FIG. 7 diagram and the frequency of the signals. The frequency detector 41 receives the intermediate frequency output from the intermediate frequency amplifier 23 and serves to provide equal or balanced outputs at both output terminals 41a and 42b when the frequency of the intermediate frequency output is a predetermined value $f_o$ and to provide unbalanced outputs at both output terminals 41a and 41b when the frequency of the intermediate frequency output is fluctuated from the said predetermined value $f_o$. More specifically, the frequency detector 41 provides a higher voltage output at the output terminal 41a and a lower voltage output at the output terminal 41b when the frequency of the intermediate frequency output is fluctuated to a frequency higher than the predetermined value $f_o$, and provides a lower voltage output at the output terminal 41a and a higher voltage output at the output terminal 41b when the frequency of the intermediate frequency output is fluctuated to a frequency lower than the predetermined fluctuated value $f_o$. A well known ratio detector may be used as the frequency detector 41. FIG. 8(c) shows a characteristic curve of such a ratio detector. The output terminals 41a and 41b are connected to junctions A and B of a bridge circuit 48, which comprises a pair of diodes D41 and D42 and a pair of transistors TR41 and TR42. A junction of the cathode of the diode D41 and a base of the transistor TR41 constitutes the junction A and a junction of the cathode of the diode D42 and a base of the transistor TR42 constitutes the junction B. A resistor is connected between a junction of the cathodes of the diodes D41 and D42, which is grounded, and a junction of the emitters of the transistors TR41 and TR42. The collectors of the transistors TR41 and TR42 supply the charging and discharging control signals 42a and 42b, to the control circuit 12. The sound or audio, level detector 45 may be a Schmidt circuit using transistors TR43 and TR44 with an input circuit including resistors for determining a detection level and the video level detector 46 may be a Schmidt circuit using transistors TR45 and TR46. The characteristic curves of the band-pass filters 43 and 44 are shown in FIGS. 8(a) and (b), respectively.

In operation of FIG. 7 embodiment, first let it be assumed that the tuning circuits in the channel selector 21 have been precisely tuned to the frequency of a desired channel. The intermediate frequency is substantially equal to the predetermined value $f_o$. Since the level of the outputs from the band-pass filters 43 and 44 exceeds thresholds P and Q of FIGS. 9(a) and (b), respectively, the transistors TR43 and TR45 of the preceding stage of the level detectors 45 and 46, respectively, turn on and thus transistors TR44 and TR46 of the succeeding stage of the level detectors 45 and 46, respectively, turn off, so that the outputs of the level detectors 45 and 46 are kept in a high level and a disabling signal 47 is derived from the gate G1. This means that both of the sound and video components are simultaneously detected. Therefore, the control circuit 12 is disabled to discontinue thereafter either a charging or discharging mode of the potential memory device 13. As a result a DC voltage value to be applied to the voltage controlled variable capacitor in the channel selector 21 is fixed to a desired value.

Now let it be assumed that a slight detuning occurs in the channel selector 21 and the frequency of the intermediate frequency output from the amplifier 23 is also fluctuated from the frequency $f_o$. The level of the sound and video components from the filters 43 and 44 is lower than the level detected by the level detectors 45 and 46, so that the disabling signal 47 from the gate G1 is not obtained and thus control circuit 12 is enabled to charge or discharge the potential memory device 13 in response to the charging control signal 42a or discharging control signal 42b.

In such a condition that a fluctuation of the intermediate frequency to a lower value or a higher value has taken place for some reason, as the case may be, than an unbalanced output, such as the lower level at the line 41a and the higher level at the line 41b in the former case and higher level at the line 41a and the lower level at the line 41b in the latter case, is obtained between the lines 41a and 41b so that the transistor TR42 turns on in the former case and the transistor TR41 turns on in the latter case, with the result that the voltage of the collector of the conducting transistor either TR41 or TR42, drops substantially to a ground potential. Therefore, in the former case a discharging control signal 42b in a low level is obtained at the transistor TR42 collector and in the latter case a charging control signal 42a in a low level is obtained at the transistor TR41 collector. As fully described later, the discharging control signal 42b forces the control circuit 12 to assume a discharging mode and thus the potential memory device 13 is discharged, whereas the charging control signal 42a forces the control circuit 12 to assume a charging mode and thus the potential memory device 13 is charged. As the potential memory device 13 is discharged or charged, the output from the device 13 is lowered or raised, respectively, and the output voltage from the DC amplifier 14 raised or lowered respectively, and the capacitance of the voltage controlled variable capacitor in the channel selector 21 decreases or increases, respectively, and thus the intermediate frequency is raised or lowered, respectively. When the intermediate frequency becomes closer to the predetermined value, again the output from the frequency detector 41 becomes balanced and near zero and thus the bridge circuit 48 becomes in a balanced condition, so that both the transistors TR41 and TR42 turn off. As a result, neither a charging nor a discharging control signal is obtained from the circuit 42, while the disabling signal 47 is obtained from the gate G1, so that the control circuit 12 is disabled thereby to discontinue further charging of the potential memory device 13.

In the FIG. 7 embodiment, both the sound and video components in the intermediate frequency output are withdrawn by means of the band-pass filters 43 and 44 and simultaneous level detection of them is used for the purpose of disabling the charging/discharging control circuit 12. Such simultaneous level detection of two components in the intermediate frequency output is preferred, in view of the fact that the intermediate frequency output comprises such two components. If only the video component had been used for the purpose of disabling the control circuit 12, than it could have occurred that the sound component is erroneously used for disabling the control circuit 12, which would have caused mistuning. Now the fourth channel of the television channels of the Japanese standard system is considered by way of example. The frequency of the video carrier wave (Fv) is 171.25MHZ and the frequency of the sound carrier wave (Fs) is 171.75MHZ for the fourth channel. Therefore, if the frequency of the local oscillator (Fo) becomes 230MHZ, the intermediate frequency (video) of 58.75MHZ is obtained by way of a difference between Fo and Fv in accordance with the following equation.

$$Fo - Fv = 230MHZ - 171.25MHZ = 58.75MHZ$$

On the other hand, when the frequency of the local oscillator (Fo) becomes 234.50MHZ, a pseudo video intermediate frequency of 58.75MHZ is obtained by way of a difference between Fo and Fs in accordance with the following equation.

$$Fo - Fs = 234.50MHZ - 175.75MHZ = 58.75MHZ$$

Therefore, if the automatic frequency control system had been so constructed that a disabling signal 47 is obtainable only in response to the video component of the intermediate frequency output, it could happen that an undesired frequency is tuned erroneously by the channel selector besides the desired proper frequency of the channel to be selected. However, in the embodiment shown, an output responsive to the simultaneous level detection of both the sound and the video components of the intermediate frequency, i.e. a logical product output of the sound and video intermediate frequencies, is used to provide a disabling signal 47 to the charging/discharging circuit 12, and therefore, the abovementioned disadvantage is eliminated. Alternatively, however, simultaneous detection of the sound component and a synchronizing pulse output or simultaneous detection of the video components and a synchronizing pulse output may be used for disabling the control circuit 12. Such a synchronizing pulse output may be either a horizontal synchronizing pulse or a vertical synchronizing pulse and is obtainable only in the event the frequency is properly tuned by the channel selector 21 from a synchronizing pulse circuit of a typical television receiver.

Figure 9:
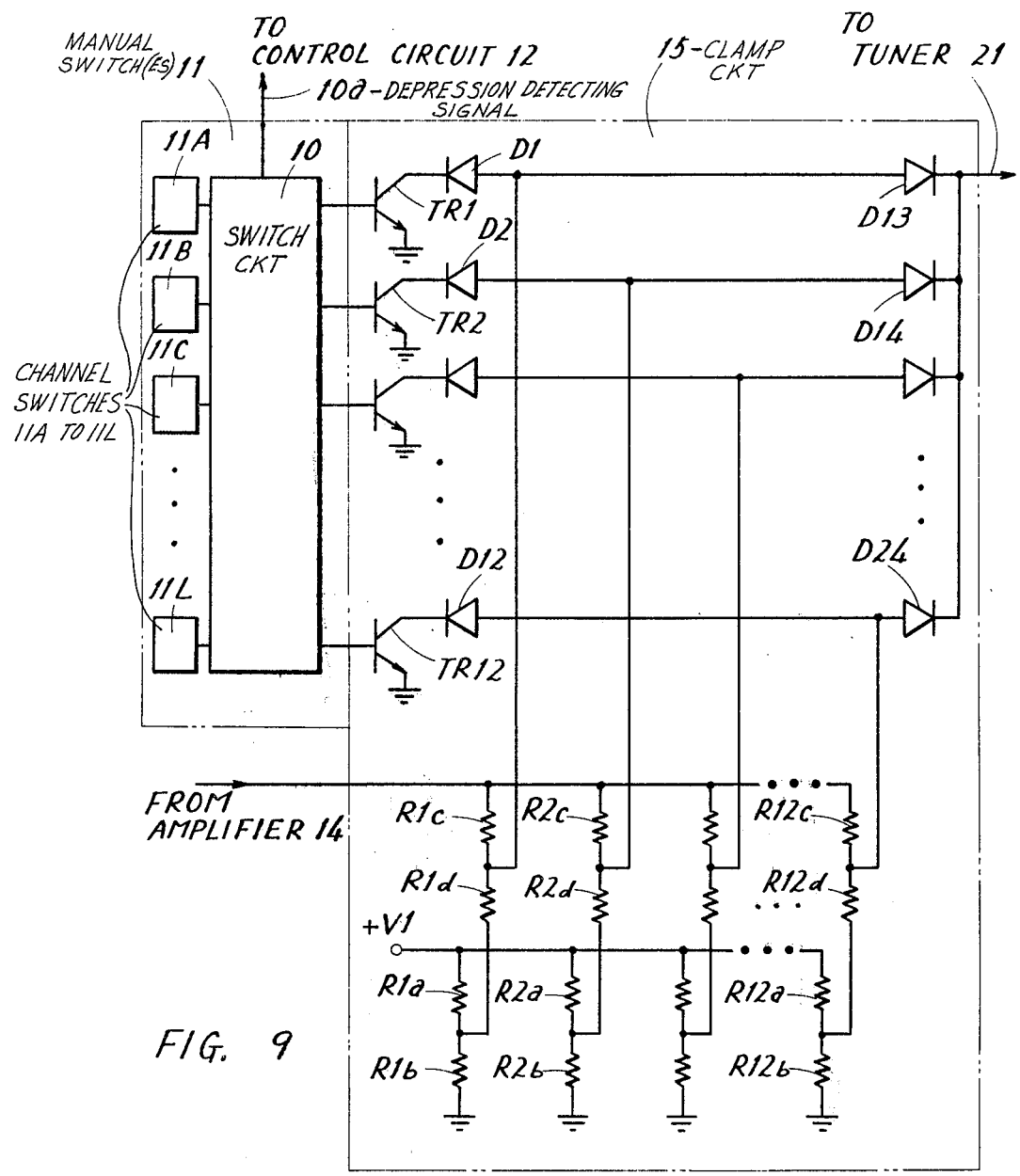
FIG. 9 shows in more detail a schematic diagram of the manually operable switch 11 and the clamp circuit 15.

FIG. 9 shows in greater detail a schematic diagram of the manually operable switch 11 and the clamp circuit 15 shown in FIG. 4. As seen from the diagram, depression of any one of channel switches 11A to 11 L causes the switch circuit 10 to turn off one of transistors TR1 to TR12 corresponding to channel switches 11A to 11L, respectively, and to turn on the remaining transistors. Further, a depression detecting signal 10a from the switch circuit 10 indicative of depression of any one of channel switches 11A to 11L enables the charging-/discharging control circuit 12, which is more fully described hereinafter. Collectors of transistors TR1 to TR12 are connected to pairs of diodes D1 to D12 and D13 and D24, respectively, and each emitter is commonly connected to the ground. Each cathode of diodes D13 to D24 is commonly connected to the voltage controlled variable capacitor in the channel selector 21. The saw tooth wave voltage from the amplifier 14 and clamping voltages which are supplied from +V1 source via voltage dividers implemented by pairs of resistors R1a, R1b–R12a, R12b are added as a function of pairs of resistors R1c, R1d–R12c, R12d, and applied to the common anodes of diodes D1–D12 and D13–D24.

In operation of FIG. 9, when any one of channel switches such as 11A is depressed, the switch circuit 10 causes the transistor TR1 associated with the switch 11A to turn off and the remaining transistors TR2–TR12 to turn on, correspondingly the diode D13 is forward biased and the other diodes D14–D24 are biased in a reverse direction. Therefore, a clamping voltage $V_A$ determined by a pair of resistors R1a and R1b clamps the saw tooth wave voltage from the DC amplifier 14 as a function of resistors R1c and R1d.

Figure 10:
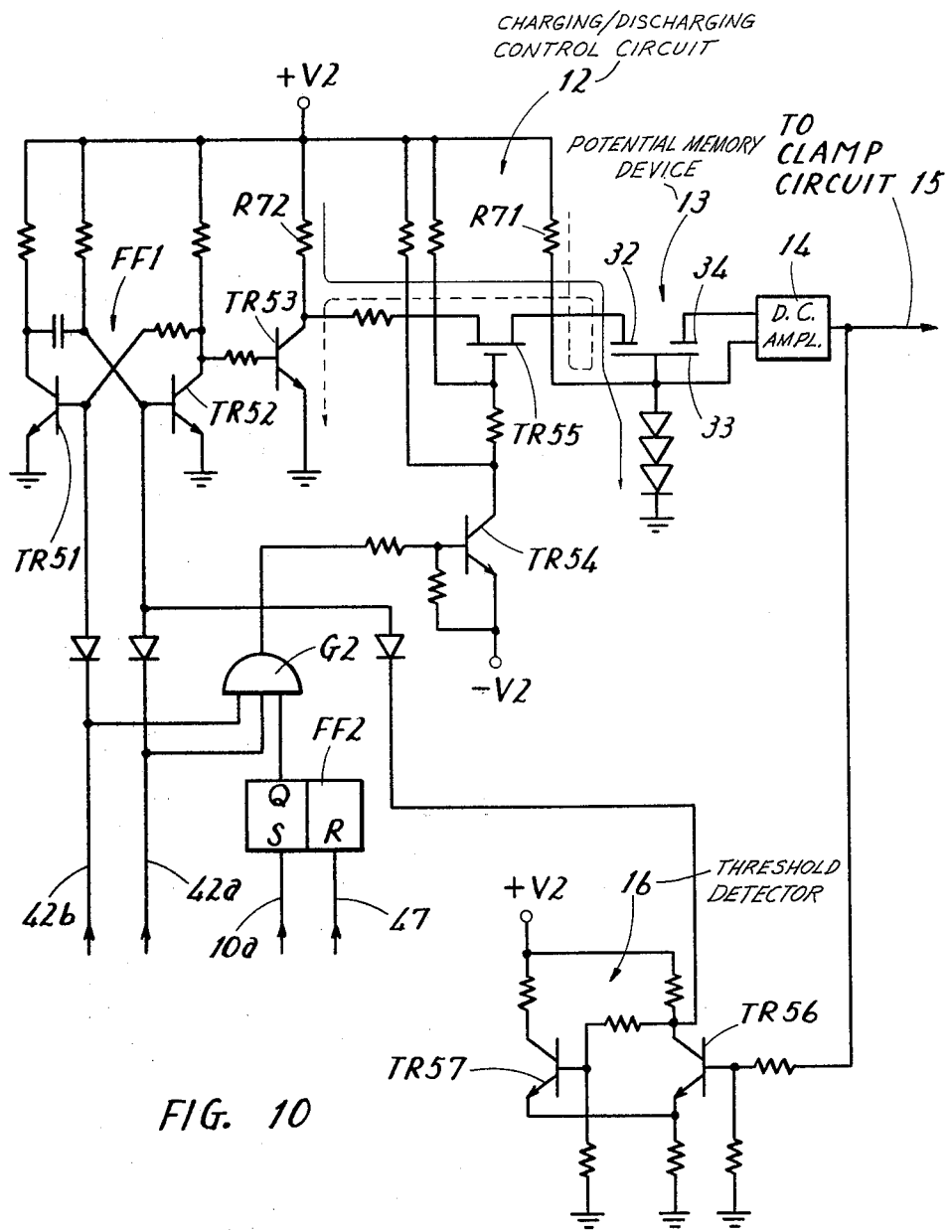
FIG. 10 shows in more detail a schematic diagram of the charging/discharging control circuit 12, the potential memory device 13, and the level detector 16.

FIG. 10 shows in more detail a schematic diagram of the charging/discharging control circuit 12, potential memory device 13, the DC amplifier 14 and the threshold detector 16 shown in FIG. 4. A mono-stable flip-flop FF1 of the charging/discharging control circuit 12 is configured so that the charging control signal 42a causes the transistor TR52 to turn off as in an unstable state and thus the collector thereof is in a high level and thereby the transistor TR53 is turned on, whereon the discharging control signal 42b causes the transistor TR51 to turn off as in a stable state and the transistor TR52 to turn on and thus the collector of the transistor TR52 is in a high level, thereby the transistor TR53 turning off. The charging control signal 42a and the discharging control signal 42b are individually coupled to disable an AND gate G2, whose remaining input terminal is connected to the output Q of an RS flip-flop FF2 which is set to enable the gate G2 by the depression detecting signal 10a and is reset by the disabling signal 47. Thus, with either the charging control signal 42a or the discharging control signal 42b present, the output of the gate G2 turns the transistor TR54 off, so that the collector voltage thereof is in a high level and hence a field effect transistor TR55 is turned on which is provided in electrical series beetween the transistor TR53 and the potential memory device 13. Therefore, a charging current flows through the potential memory device 13 from the anode 33 to the cathode 32 via a resistor R71 and transistors TR55 and TR53 in a direction as shown in a dotted line when the charging control signal 42a is obtained and accordingly the transistor TR53 is turned on. On the other hand, a discharging current flows through the potential memory device 13 from the cathode 32 to the anode 33 through a resistor R72 and the transistor TR55 in a direction as shown in a solid line when the discharging control signal 42b is obtained and accordingly the transistor TR53 is turned off.

The rate of change in the terminal voltage of the device 13 and thus the output from the DC amplifier 14 primarily depends on the resistance values of resistors R71 and R72. A relation of resistance of the resistors R71 and R72 is so chosen that the charging operation mode is effected in a very quick manner as compared with the discharging operation mode. For this purpose, resistance of the resistor R71 is much smaller than that of the resistor R72.

The threshold detection circuit 16 may be a Schmidt circuit including transistors TR56 and TR57. When the potential memory diode 13 continues to be discharged and the output voltage from the amplifier 14 exceeds the predetermined threshold of the threshold detection circuit 16, the transistor TR56 is turned on so that the collector thereof is in a low level, and thus the flip-flop FF1 is in the unstable state and the transistor TR53 is turned on. Thus a charging current path is established.

Figure 11:
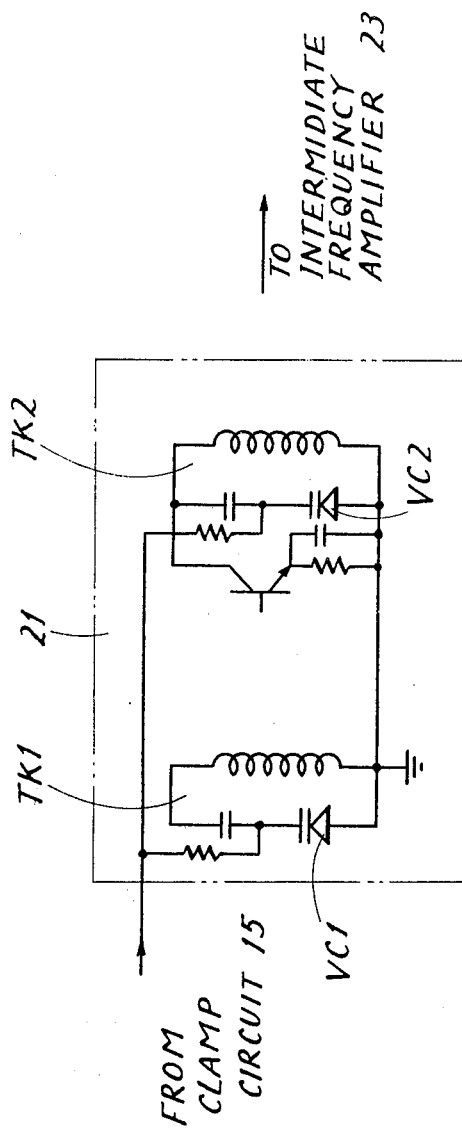
FIG. 11 shows in more detail a schematic diagram of the channel selector 21.

FIG. 11 shows in more detail a schematic diagram of the channel selector 21, which comprises a first tuning circuit TK1 for a high frequency amplifier and a second tuning circuit TK2 for a local oscillator. The tuning circuits TK1 and TK2 each comprise voltage controlled variable capacitance diodes VC1 and VC2 as a portion of a capacitance element of the tuning circuit and the output from the clamp circuit 15 is applied to these voltage controlled variable capacitance diodes in a reverse direction. More detailed structure and operation of the channel selector 21 are well known to those skilled in the art. Briefly described, a higher output from the clamp circuit 15 biases the voltage controlled variable capacitance diodes VC1 and VC2 harder in a reverse direction, and thus decreases the capacitance across the junctions of these diodes VC1 and VC2, and as a result makes higher the tuning frequency of the tuning circuits TK1 and TK2, and vice versa.

Figure 12:
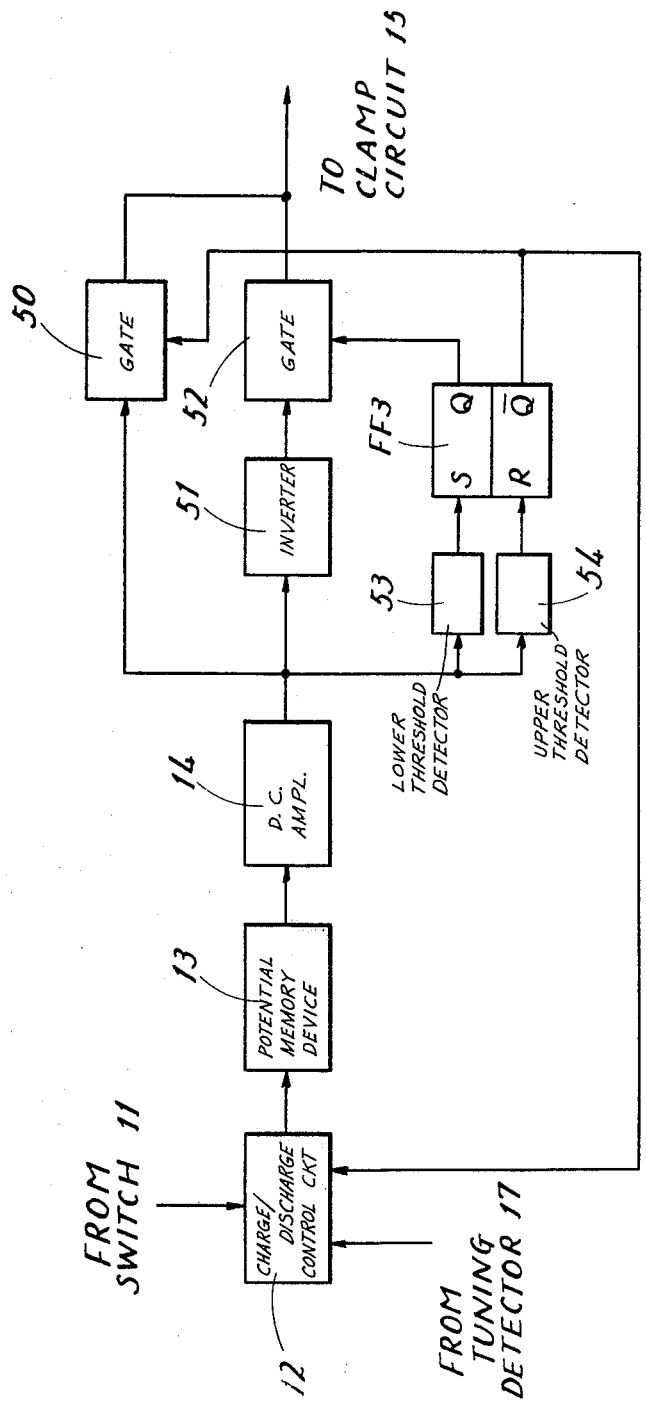
FIG. 12 shows an alternative embodiment of blocks 12, 13, 14 and 16 in FIG. 4, FIGS. 13a, 13b, 13c, 13d and 13e show the relation between voltage appearing at various portions in FIG. 12 diagram and the lapse of time.

FIG. 12 shows an alternative embodiment of blocks 12, 13, 14 and 16 of FIG. 4, which generates a saw tooth wave utilizing a potential memory device 13. A charging/discharging control circuit 12 of FIG. 12 is similar to that of FIG. 4, except that the charging time period is extended to be equal to the discharging time period. An output of the potential memory device 13 is supplied to a DC amplifier 14. An output from the amplifier 14 is fed through a gate 50 to the clamp circuit 15 and also through an inverter 51 and a gate 52 to the clamp circuit 15. An output from the amplifier 14 is also fed to a lower threshold detector 53 and an upper threshold detector 54 which may be Schmitt circuits, so that either of the outputs from detectors 53 and 54 in response to a predetermined lower threshold or upper threshold of the output from the amplifier 14 sets or resets a fip-flop FF3, respectively. A reset output of the flip-flop FF3 is connected to the gate 50 to allow the amplified voltage signal to pass therethrough and a set output of the flip-flop FF3 is connected to the gate 52 to allow the amplified and inverted voltage signal to pass therethrough to the clamp circuit 15. The reset output of the flip-flop FF3 is also connected to the charging/discharging control circuit 12, so that the circuit 12 is caused to reverse the charging or discharging operation mode.

Figure 13:
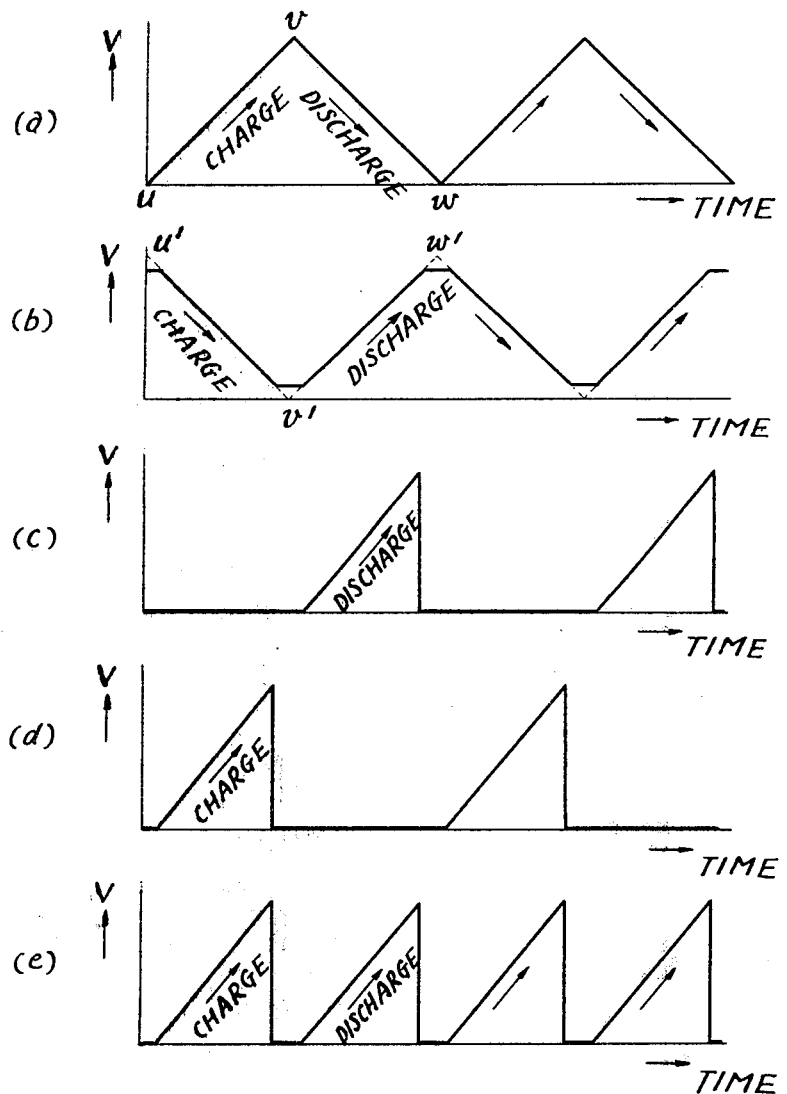

The operation of the FIG. 12 embodiment will be better understood by the following description with simultaneous reference to FIG. 13, which shows a relation between voltages appearing at various portions in FIG. 12 diagram and the lapse of time. For the purpose of describing the operation of the embodiment shown, the switch 11 is manually operated. Further let it be assumed that no television signal has been broadcast in any channel. FIG. 13(a) shows a relation of the output terminal voltage of the potential memory device 13 and the lapse of time in operation of the inventive apparatus in such a situation. More specifically, when the switch 11 is manually operated, the charging/discharging control circuit 12 is enabled to be in a charging mode and thus the potential memory device 13 is charged. A change in the voltage at the output terminal of the device 13 is shown in FIG. 13(a) as from the origin $u$ to a point $v$. If the device 13 had been caused to continue further the charging mode, then the device 13 would have been destroyed because of overcharging. However, in the embodiment shown, an output from the DC amplifier 14, which corresponds to the voltage of the device 13 at the point $v$ but has been amplified and inverted by the amplifier 14, is threshold-detected by the lower threshold detector 53 to cause the flip-flop FF3 to be set. Therefore, no reset output from the flip-flop FF3 is applied thereafter to the charging/discharging control circuit 12 so that the control circuit 12 is caused to be in a discharging mode, and thus the potential memory device 13 is discharged thereafter. A change in the voltage at the output terminal of the device 13 during this period of time is shown in FIG. 13(a) as from the point $v$ to the point $w$. In the embodiment shown, an output from the DC amplifier 14, which corresponds to the voltage of the device 13 at the point $w$ but has been amplified and inverted by the amplifier 14, is threshold-detected by the upper threshold detector 54 to cause the flip-flop FF3 to be reset. The reset output from the flip-flop FF3 is applied thereafter to the charging/discharging control circuit 12 so that the control circuit 12 is caused to be in a charging mode again. Thereafter the same operation is repeated as mentioned above. FIG. 13(b) shows a change in the voltage at the output of the DC amplifier 14, in which the points $u'$, $v'$ and $w'$ corresponds to the points $u$, $v$ and $w$, respectively, in the graph of FIG. 13(a).

It is understood from the foregoing description that in a time period of the charging mode a set output is provided from the flip-flop FF3 to enable the gate 52 and in a time period of the discharging mode a reset output is provided from the flip-flop FF3 to enable the gate 50. Therefore, in the discharging mode period of time an output from the DC amplifier 14 is allowed to pass through the gate 50 to the clamp circuit 15. An output from the gate 50 is shown in FIG. 13(c). On the other hand, in the charging mode period of time an output from the DC amplifier 14 is allowed, after inverted by the inverter 51, to pass through the gate 52 to the clamp circuit 15. An output from the gate 52 is shown in FIG. 13(d). As a result, the clamp circuit 15 will receive a combined output of outputs those from gates 50 and 52, a wave form of which is shown in FIG. 13(e).

Figure 14:
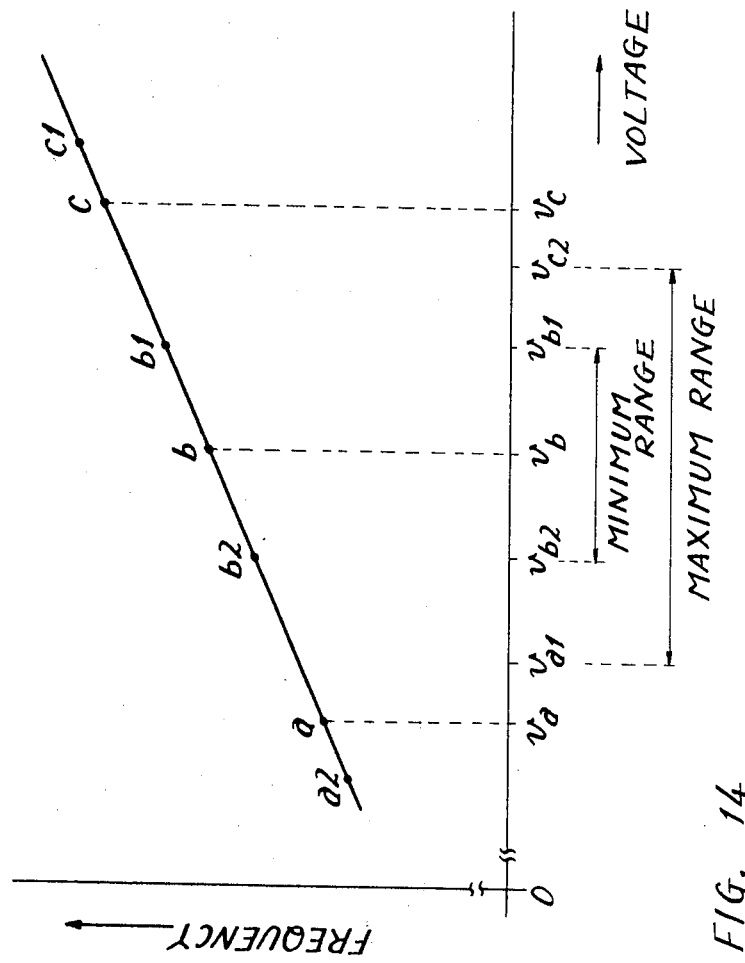
FIG. 14 is a graph illustrating how the range of voltage applied to a voltage controlled capacitor should be chosen.

FIG. 14 shows a relation between a tuning frequency and a voltage applied to the voltage controlled capacitor in the channel selector 21, wherein individual application of voltages $v_a$, $v_b$ and $v_c$ to the capacitor, in normal condition, makes TV channels $CH_A$, $CH_B$ and $CH_C$ be received at points $a$, $b$ and $c$, respectively. For the purpose of determining the minimum amplitude of a saw tooth wave from DC amplifier 14 of FIG. 4 or from gates 50, 52 of FIG. 12 necessary to receive a TV channel, e.g. $CH_B$, let it be assumed that the tuning frequency deviation could occur from the point $b$ to the point $b1$ due to (1) the probable output voltage deviation from the clamp circuit 15, (2) drifting voltage fluctuation of a voltage source coupled to the voltage controlled capacitor and (3) a threshold detection level deviation of the detector 16 of FIG. 4 or detectors 53, 54 of FIG. 12. In this situation, it is necessary to apply a voltage $v_{b2}$ lower than $v_b$ to the voltage controlled capacitor so that the channel selector 21 tunes to the channel $CH_B$. On the contrary, if the tuning frequency in the channel selector 21 deviates from point $b$ to the point $b2$, then the channel selector 21 requires to be supplied with a voltage $v_{b1}$ higher than $v_b$ so that the channel $CH_B$ is tuned. In this way, the minimum range of the saw tooth wave amplified required to receive the channel $CH_B$ is determined to cover the voltage deviation $v_{b2}$ to $v_{b1}$ irrespective of the abovementioned events.

For the purpose of determining the maximum amplitude range of a saw tooth wave associated with TV channel $CH_B$, now let it be assumed that the tuning frequency deviation could occur from the point $a$ to the point $a2$, in other words, channel $CH_A$ is tuned at voltage $v_{a1}$, due to the (1) drifting voltage fluctuations of a voltage source coupled to the voltage controlled capacitor and (2) a threshold detection level deviation of the detector 16 or 53, 54. Therefore, a voltage applied to the voltage controlled capacitor should not be reduced below $v_{a1}$ in order not to receive an adjacent TV channel $CH_A$. On the contrary, if the tuning frequency deviates from the point $c$ to the point $c1$, in other words, the channel $CH_C$ is tuned by applying a voltage $v_{c2}$ to the capacitor, then a voltage applied to the capacitor should not be above $v_{c2}$. Thus the maximum range of the saw tooth wave amplitude required to receive the channel $CH_B$ and not to receive the channels $CH_A$ and $CH_C$ is from $v_{a1}$ to $v_{c2}$.

In another preferred embodiment, all channels are grouped into some number of sets of two or more channels and each DC clamping voltage is so chosen as to correspond to each set individually. The combination of the saw tooth wave and clamping voltage may be chosen such that the abovementioned two or more channels are selectively tuned by the channel selector 21 associated with one saw tooth wave. As a result, the inventive apparatus, particularly the clamp circuit 15, is simplified and requires less circuit components.

In the foregoing the embodiments of the present invention have been described as embodied in the television receiver. However, it is apparent that the present invention can be embodied in conjunction with any equipment comprising a tuning apparatus, such as an AM radio receiver, FM radio receiver, and the like. It would further be possible to make many changes and modifications of the present invention without departing from the spirit and scope of the present invention. Therefore, it is intended that the true scope of the present invention is covered only by the appended claims.

What is claimed is:

1. An automatic, tuning apparatus for use in a television receiver, comprising:
    a potential memory device exhibiting a terminal voltage changing as a function of the charging or discharging quantity of electricity supplied to said device by a flow of current therethrough selectively in a charging or discharging direction, respectively,
    means for clamping the terminal voltage of the potential memory device including means for supplying a selected, fixed voltage and means for superposing the terminal voltage of the potential memory device on the said selected, fixed voltage to produce a combined, clamped voltage,
    tuning means for said television receiver for generating a tuning frequency and comprising a voltage controlled variable reactance device and means for supplying a voltage associated with said combined, clamped voltage from said clamping means to said variable reactance device, whereby the tuning frequency output of said tuning means is controlled in accordance with said combined, clamped voltage,
    means coupled to said tuning means for providing a signal indicative of the degree of tuning of said tuning means,
    means connected to said potential memory device for supplying said flow of current therethrough to said potential memory device in a direction for selectively charging or discharging said potential memory device and correspondingly changing the terminal voltage thereof, thereby causing a change in the reactance of said voltage controlled reactance device and thus a scanning change in the tuning frequency of said tuning means in the corresponding selected direction, said current providing means controlling the extent of change of said terminal voltage and correspondingly the change of the associated voltage supplied to said voltage controlled variable reactance, for controlling the tuning frequency of said tuning means and receiving a desired, corresponding television channel,
    means for enabling said current supplying means for initiating said scanning change in the tuning frequency of said channel selector
    said television receiver including an intermediate frequency stage producing an intermediate frequency output including video component and sound component outputs and including means for separating synchronizing pulses from a received signal and producing a separated synchronizing pulse output,
    means responsive to operation of said enabling means for starting charging or discharging or said potential memory device and thus said scanning change in the tuning frequency of said tuning means and responsive to said signal indicative of the degree of tuning of said tuning means, for disabling said current supplying means for discontinuing said charging and discharging of said potential memory device and correspondingly said scanning change in the tuning frequency of said tuning means of said potential memory device, said disabling means including at least two means responsive to at least two of said video component outputs, said sound component output and said synchronizing pulse output and means responsive to the simultaneous occurence of said at least two outputs for disabling said current providing means for discontinuing said scanning change in the tuning frequency of said tuning means.

2. The automatic tuning apparatus in accordance with claim 1, in which said potential memory device is a solid state electrochemical potential memory device comprising:
    a cathode including an active metal,
    an anode comprising an alloy including said metal, and
    a solid state electrolyte having high ion conductivity sandwiched between said cathode and said anode,
    said potential memory device exhibiting a terminal voltage between said anode and said cathode linearly changing as a function of the charging or discharging quantity of electricity supplied to said device in accordance with the anode thereof being positive or negative, respectively.

3. The automatic tuning apparatus in accordance with claim 2, in which said cathode comprises
    a main cathode including an active metal connected to said current providing means, and
    an auxiliary cathode including an active metal connected to said voltage controlled variable reactance device.

4. The automatic tuning apparatus in accordance with claim 2, in which the cathode of said device includes Ag and th anode thereof includes an alloy of Ag and a chalcogen element.

5. The automatic tuning apparatus in accordance with claim 1, in which said potential memory device is a capacitor.

6. The automatic tuning apparatus in accordance with claim 1, in which said fixed voltage supplying means of said clamping means comprises means for supplying a plurality of different fixed voltages, and means for selecting a desired one of said fixed voltages for clamping said terminal voltage.

7. The automatic tuning apparatus in accordance with claim 6, in which said selecting means comprises:
    means for individually and selectively providing a corresponding plurality of individual selection signals, and
    switching means responsive to said individual selection signals for selecting the respectively corresponding, fixed voltage.

8. The automatic tuning apparatus in accordance with claim 7, in which said switching means comprises diodes connected to be conductive in response to said individual selection signals.

9. The automatic tuning apparatus in accordance with claim 1, in which said fixed voltage supplying means comprises a potential divider.

10. The automatic tuning apparatus in accordance with claim 1, in which said enabling means is a manual switch.

11. The automatic tuning apparatus in accordance with claim 1, which further comprises means responsive to a predetermined level of terminal voltage of said potential memory device for controlling said current supplying means to switch the direction of supply of current from a present to the opposite direction, thereby to change from one to the other of the charging and discharging operations of said potential memory device.

12. The automatic tuning apparatus in accordance with claim 1, which further comprises means responsive to a predetermined level of terminal voltage of said potential memory device for determining the time at which said charging or discharging operation of said potential memory device is changed.

13. The automatic tuning apparatus in accordance with claim 11, which further comprises means responsive to a predetermined level of terminal voltage of said potential memory device for reversing the direction of change of said terminal voltage of the potential memory device to be supplied to said variable reactance device.

14. The automatic tuning apparatus in accordance with claim 1, in which said disabling means comprises means for detecting the frequency of the output from said tuning means for controlling said current supplying means to be in a charging or discharging mode depending upon the direction of fluctuation of detected frequency.

15. The automatic tuning apparatus in accordance with claim 14, in which said frequency detecting means is a ratio detector.

16. The automatic tuning apparatus in accordance with claim 1 for use in a television receiver, in which said tuning means is a channel selector for said television receiver.

17. The automatic tuning apparatus in accordance with claim 16, in which said current providing means controls the extent of change of said terminal voltage and correspondingly the range of voltage supplied to said voltage controlled variable reactance, for receiving a desired, corresponding television channel.

18. An automatic tuning apparatus in accordance with claim 1, in which said at least two outputs are the video and sound component outputs.

19. An automatic tuning apparatus in accordance with claim 1, in which said at least two outputs are the video component output and the synchronizing pulse output.

20. An automatic tuning apparatus in accordance with claim 1, in which said at least two outputs are the sound component output and the synchronizing pulse output.

21. An automatic tuning apparatus in accordance with claim 1, in which said disabling means is responsive to the simultaneous occurence of the video and sound component outputs and the synchronizing pulse output.

22. An automatic tuning apparatus for use in a televis receiver for automatically tuning to the frequency of one of a plurality of television channels selected for reception, comprising:

a potential memory device exhibiting a terminal voltage changing as a function of the charging or discharging quantity of electricity supplied to said device by a flow of current therethrough selectively in a charging or discharging direction, respectively, means for selectively supplying a desired one of a plurality of fixed voltages corresponding to said plurality of channels, clamping means for superposing the terminal voltage of the potential memory device on the said selected, fixed voltage to produce a combined, clamped voltage, tuning means for said television receiver for generating a tuning frequency and comprising a voltage controlled variable reactance device and means for generating a control voltage as a function of said combined, clamped voltage from said clamping means, and for applying said control voltage to said variable reactance device to control the tuning frequency output of said tuning means, means coupled to said tuning means and responsive to the relationship of the tuning frequency of said tuning means relative to the frequency of a channel selected to be received, and producing charge and discharge enable signals for correspondingly enabling charging and discharging of said potential memory device to change the frequency of said tuning means in accordance with a difference between the tuning frequency and a selected channel frequency, means responsive to said fixed voltage selective supplying means for generating a scanning enable signal upon selection of a different one of said fixed voltages corresponding to selection of a different television channel to be received, said television reciver including an intermediate frequency stage producing an intermediate frequency output including a video component output annd a sound component output, means for threshold detecting said video and sound component outputs and producing corresponding video and sound threshold detected outputs indicative of tuning of said tuning means to the frequency of a selected television channel, means responsive to the simultaneous presence of said video and sound component threshold detected outputs to produce a disable output, means connected to said potential memory device for supplying a flow of current thereto selectively in first and second, opposite directions for selectively charging and discharging said potential memory device and correspondingly changing the terinal voltage thereof, thereby changing the reactance of said voltage controlled reactance device and changing the tuning frequency of said tuning means in a corresponding, selected direction, said current flow supply means being responsive to said charging and discharging enable signals to correspondingly supply said flow of current in said charging and discharging directions, and means responsive to said enabling signal from said enabling means to enable said current supplying means to supply a flow of current to said potential memory device and responsive to said disable signal to disable said current supply means from supplying any further flow of current to said potential memory device.

* * * * *

UNITED STATES PATENT AND TRADEMARK OFFICE
CERTIFICATE OF CORRECTION

PATENT NO. : 3,967,057
DATED : June 29, 1976
INVENTOR(S) : Kazuyoshi Tsukamoto et al It is certified that error appears in the above—identified patent and that said Letters Patent are hereby corrected as shown below:

```
At "[75]", line 1, "Hirakata" should be --Osaka--.
At "[75]", line 3, "Higashiosaka" should be --Osaka--.
At "[75]", line 4, "Hirakata" should be --Osaka--.
In the Abstract, line 6, after "frequency" insert --thereof--.
Column 2, line 60, change "rpovision" to --provision--.
Column 11, line 20, after "42b" insert --respectively,--.
Column 19, line 65, change "televis" to --television--.
Column 20, line 39, change "annd" to --and--.
Column 20, line 52, change "terinal" to --terminal--.
```

Signed and Sealed this

Twenty-eighth Day of September 1976

[SEAL]

Attest:

RUTH C. MASON
*Attesting Officer*

C. MARSHALL DANN
*Commissioner of Patents and Trademarks*